(12) United States Patent
Candidus et al.

(10) Patent No.: US 7,639,011 B2
(45) Date of Patent: Dec. 29, 2009

(54) FIELD DISTRIBUTION CORRECTION ELEMENT AND METHOD FOR GENERATING A MAGNETIC RESONANCE EXPOSURE THEREWITH

(75) Inventors: Yvonne Candidus, Tuchenbach (DE); Helmut Greim, Adelsdorf (DE); Markus Vester, Nürnberg (DE); Steffen Wolf, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 114 days.

(21) Appl. No.: 12/046,837

(22) Filed: Mar. 12, 2008

(65) Prior Publication Data

US 2008/0224702 A1 Sep. 18, 2008

(30) Foreign Application Priority Data

Mar. 12, 2007 (DE) ...................... 10 2007 011 840

(51) Int. Cl.
*G01V 3/00* (2006.01)
(52) U.S. Cl. ...................... 324/318; 324/320; 600/421

(58) Field of Classification Search ................. 324/318, 324/320, 322; 600/421, 422
See application file for complete search history.

(56) References Cited

U.S. PATENT DOCUMENTS

| 5,865,177 | A | 2/1999 | Segawa |
| 7,002,347 | B2 * | 2/2006 | Feiweier et al. ............. 324/318 |
| 7,492,156 | B2 * | 2/2009 | Candidus et al. ............ 324/318 |
| 2004/0186375 | A1 * | 9/2004 | Vavrek et al. ............... 600/422 |
| 2005/0245816 | A1 | 11/2005 | Candidus et al. |
| 2007/0269383 | A1 | 11/2007 | Candidus et al. |
| 2007/0279054 | A1 | 12/2007 | Candidus et al. |

* cited by examiner

*Primary Examiner*—Louis M Arana
(74) *Attorney, Agent, or Firm*—Schiff Hardin LLP

(57) ABSTRACT

A field distribution correction element for positioning on an examination subject in a magnetic resonance system for local influencing of the radio-frequency field distribution during a magnetic resonance acquisition has a system of electrically conductive dipole strips essentially running in parallel, arranged on a carrier element. In a corresponding method for generation of magnetic resonance exposures of an examination subject in a magnetic resonance system, for local influencing of the radio-frequency field distribution, such a field distribution correction element is positioned on the patient.

15 Claims, 4 Drawing Sheets

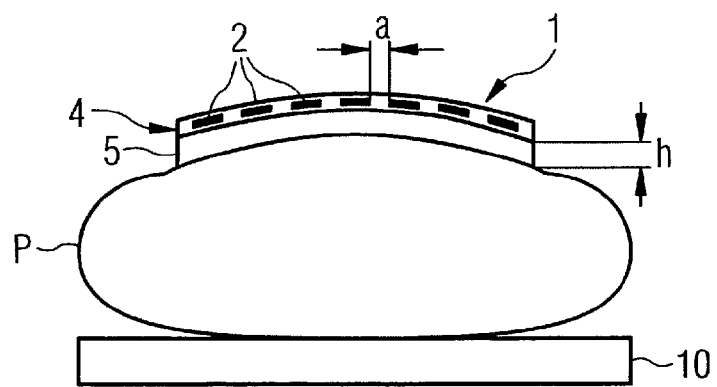
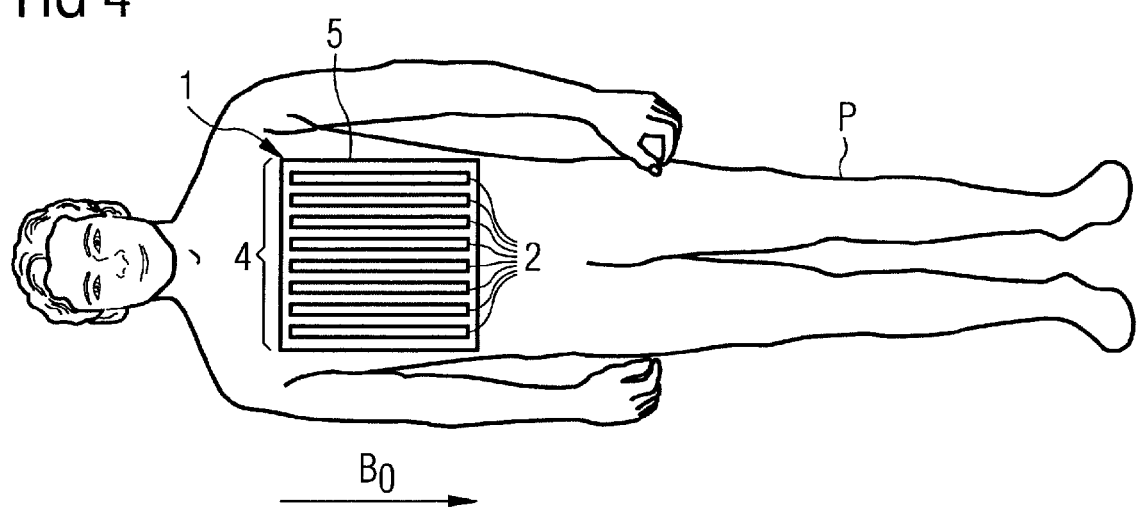

FIELD DISTRIBUTION CORRECTION ELEMENT AND METHOD FOR GENERATING A MAGNETIC RESONANCE EXPOSURE THEREWITH

BACKGROUND OF THE INVENTION

1. Field of the Invention

The present invention concerns a field distribution correction element for positioning on an examination subject in a magnetic resonance system for local influencing the $B_1$ field distribution during a magnetic resonance acquisition. Moreover, the invention concerns a method for generation of magnetic resonance exposures of an examination subject in which a corresponding field distribution correction element is positioned on the examination subject for local influencing of the $B_1$ field distribution, as well as the use of the field distribution correction element for homogenization of a $B_1$ field in a magnetic resonance system.

2. Description of the Prior Art

Magnetic resonance tomography is a widespread technique for acquisition of images of the inside of the body of a living examination subject. In order to acquire an image with this method, i.e. to generate a magnetic resonance exposure of an examination subject, the body or the body part of the patient to be examined must initially be exposed to an optimally homogeneous, static basic magnetic field (designated as a $B_0$ field) which is generated by a basic field magnet of the magnetic resonance measurement apparatus. Rapidly switched generation devices for spatial coding are superimposed on this basic magnetic field during the acquisition of the magnetic resonance images, these gradient fields being generated by gradient coils. Moreover, RF pulses of a defined field strength are radiated with a radio-frequency antenna into the examination volume in which the examination subject is located. unwanted variations in the acquired magnetic resonance signal that can adulterate the measurement result.

The RF pulses disadvantageously exhibit an inhomogeneous penetration behavior in conductive and dielectric media (such as, for example, tissue) precisely at the high magnetic field strengths of the type that are inevitably present in magnetic resonance tomograph due to the required basic magnetic field $B_0$. This leads to the situation that the $B_1$ field can vary strongly within the measurement volume. Special measures therefore must be taken in order to achieve an optimally homogeneous distribution of the transmitted RF field of the radio-frequency antenna in the entire volume, in particular in examinations known as ultra-high field magnetic resonance examinations, in which modern magnetic resonance systems with a basic magnetic field of three Tesla or more are used.

A simple but effective approach to solve the problem is to modify the electrical environment (namely the dielectrical) of the examination subject in a suitable manner in order to compensate for unwanted inhomogeneities. For example, dielectric elements with defined high dielectricity constant $\in$ (preferably $\in\geq 50$) can be positioned in the examination volume for this, for example directly on the patient or at the patient. For example, the typical RF field minima occurring in magnetic resonance examinations of a patient in the chest and abdomen region can be compensated by placing corresponding dielectric elements, which compensate the minima by causing a local increase in the penetrating radio-frequency field, on chest and abdomen of the patient.

For example, distilled water decanted into a plastic film bag can be used as such a dielectric element. Unfortunately, the use of such "dielectric cushions" filled with water has the unwanted side effect that they are visible in the magnetic The magnetic flux density of these RF pulses is typically designated $B_1$. The pulse-shaped radio-frequency field is therefore generally called a $B_1$ field. The nuclear spins of the atoms in the examination subject are excited by these RF pulses such that they are deflected from their equilibrium state (which is parallel to the basic magnetic field $B_0$) by an amount known as an "excitation flip angle" (also called "flip angle"). The nuclear spins then precess around the direction of the basic magnetic field ($B_0$. The magnetic resonance signals thereby generated are acquired by one or more radio-frequency acquisition antennas. The acquisition antenna can be either the same antenna with which the radio-frequency pulses are radiated, or a separate acquisition antenna. The magnetic resonance images of the examination subject are generated on the basis of the acquired magnetic resonance signals. Each image point in the magnetic resonance image is thereby associated with a small body volume (known as a "voxel") and every brightness or intensity value of the image points is linked with the signal amplitude of the magnetic resonance signal acquired from this voxel. The correlation between a radiated RF pulse with the field strength $B_1$ and the flip angle $\alpha$ produced thereby is given by the equation $$\alpha = \int_{t=0}^{\tau} \gamma \cdot B_1(t) \cdot dt, \qquad (1)$$

wherein $\gamma$ is the gyromagnetic ratio (which can be considered as a fixed material constant for most nuclear magnetic resonance examinations) and $\tau$ is the effective duration of the radio-frequency pulse. The flip angle produced by an emitted RF pulse, and thus the strength of the magnetic resonance signal, consequently also depend on the strength of the radiated $B_1$ field in addition to the duration of the RF pulse. Spatial fluctuations in the field strength of the excited $B_1$ field therefore lead to resonance exposures. Therefore a "dielectric cushion" with a filling containing a relaxation agent is proposed in DE 10 2004 015 859 A1. By the addition of the relaxation agent, it is ensured that the protons in the dielectric cushion relax more quickly and therefore are not registered in the image data acquisition. The cushion is virtually invisible in the image. Such cushions, however, have an unwanted influence on the $B_0$ field. The homogenization of the transmitted RF field is additionally not yet optimal. In DE 10 2006 025 940 it is therefore proposed to introduce the relaxation agent into the filling of the dielectric cushion such that it is bound to particles separated from one another. The introduction of free charge carriers into the dielectric element is thereby largely avoided, and the conductivity of the filling of the dielectric cushion is clearly reduced. This leads to a reduction of the shielding effect and thus in total to a significantly stronger homogenization effect.

A further disadvantage of cushions with low-viscosity (i.e. liquid) contents (such as, for example, distilled water) is that these cushions are uncomfortable in handling and to an extent are even unsuitable if, for example, the shape of the cushion is altered by gravity. High requirements with regard to density and rigidity are then additionally posed on the material of the cushion enclosure. For these reasons, the fillings in the two types of cited cushions are fashioned as gels and are thereby more form-stable and better usable. They additionally exhibit all desired properties such as a good homogenization of the transmitted and acquired RF field, an invisibility in MR images, and in a biological interaction by the employed fillings. However, an optimized cushion size of approximately 35 cm×25 cm×4 cm results for these types of dielectric cushions, and the weight of the filling is approximately 3.5 kg. A cushion thickness of 4 cm is an essential parameter for effectiveness of the cushion.

Both the relatively large thickness and the high cushion weight have disadvantages. Stressing of the abdominal cavity with a heavy cushion is often perceived by the patient to be uncomfortable. Moreover, given the use of an additional local coil, the separation (spacing) of the appertaining local coil from the patient distinctly increases due to the cushion located between local coil and patient's body, so the signal-to-noise ratio of the acquired signals is poorer.

SUMMARY OF THE INVENTION

It is an object of the present invention to further develop a field distribution correction element of the aforementioned type as well as a method for generation of magnetic resonance exposures using such a field distribution correction element such that the field distribution correction element is lighter and thinner.

This object is achieved according to the invention by a field distribution correction element that includes a system (family) of electrically conductive dipole strips essentially proceeding in parallel with each other that is arranged on a carrier element. This field distribution correction element is positioned directly on the examination subject according to the inventive method so that the dipole strips run essentially parallel to the basic magnetic field of the magnetic resonance system.

The dipole strips act similar to a dipole antenna. The E-field of the emitted radio-frequency field directly couples into the dipole strips. The dipole strips thereupon passively oscillate as well, emit the energy again and thus increase the B1 field energy in the region of the body region of the patient abutting the field distribution correction element. Current loops thereby form in the body of the patient due to the E-field coupled into the dipole strips, which current loops run along the dipole strips, pass through the cushion and meet the skin and then close through the patient tissue. A current that in turn produces a secondary radio-frequency field is excited within these current loops by the components of the B1 field running transverse to the loop plane.

An alignment of the dipole strip system essentially parallel to the B0 field (i.e. optimally precisely parallel or at least at only a small angle) ensures that the E-field component of the radio-frequency field which should couple in the dipole strips is large in the longitudinal direction of the dipole strips. The coupling is particularly good with such an alignment.

A capacitive coupling of the dipole ends at the tissue is desired in order to optimally significantly increase the field within the patient body in turn via a good uncoupling of the energy from the dipole strips. A very thin carrier element is therefore sufficient, in an extreme case even a simple plastic film or the like, for example. This carrier element thereby serves primarily so that the dipole strips are firmly connected with one another as a dipole strip system and have a fixed equidistant separation, wherein they are electrically insulated from one another, however.

It has proven to be the case that an exceptional correction of the B1 field (comparable with the use of the aforementioned dielectric cushions) can be achieved with such an advantageously very simple field distribution correction element which has only a relatively thin carrier element and electrically conductive dipole strips essentially running in parallel arranged thereupon. Such a field distribution correction element is significantly thinner and lighter than a conventional ideal dielectric cushion. The handling is simplified by the much lighter weight and the patient is less stressed and thus more cooperative. Given a use of an additional local coil this can be arranged at a significantly smaller distance from the patient, which has as a result an improvement of the signal-to-noise ratio.

Basically any sufficiently conductive material can be used to produce the dipole strips. In a particularly simple and effective embodiment the dipole strips are formed from metal conductor strips which are applied running next to one another in parallel at corresponding intervals on the carrier element, for example.

Preferably, the length of the dipole strips is smaller than or approximately equal to half the wavelength $\lambda$ of the emitted $B_1$ field (i.e. the magnetic resonance frequency).

If the length of the dipole strips is shorter than half the wavelength of the magnetic resonance frequency, this means that the dipole eigenresonance is higher than the operating frequency of the dipoles, taking into account the environmental influence. The entire impedance of the current loops formed by the dipole strips is thus capacitive. The secondary B1 field within the loops is therefore approximately equiphase with the primary radio-frequency transmission field, such that in a region close to the cushion a field increase is achieved that is particularly well suited to a compensation of field minima frequently occurring in this region. The strength of these secondary correction fields can thus be controlled via the selection of the dipole length. An approximation to half the length of the resonance frequency (i.e. the emitted magnetic resonance frequency) intensifies this effect.

As mentioned above, the dipole strips could in principle be placed directly on the skin or on a film-like thin carrier element. A risk then exists, however, that current density concentrations may occur at the edges of the dipole strips that could lead to local burns of the skin under disadvantageous conditions. A carrier element is therefore advantageously used that exhibits a predetermined thickness, preferably $\geq 3$ mm, particularly preferably $\geq 5$ mm and advantageously $\leq 12$ mm. A specific separation of the dipole strips from the examination subject is maintained via this carrier element when the field distribution correction element is positioned on the examination subject insofar as the field distribution correction element is used such that the carrier element is located between the dipole strips and the body surface. The cushion thereby has primarily the function to smoothly distribute the current density. The thickness required for this is comparable to the interval of the dipole strips from one another. This means that is preferably ensured that the thickness of the carrier element approximately corresponds to the interval between two dipole strips. A dipole system which comprises optimally many narrow, closely adjacent dipole strips is consequently advantageous in order to make the cushion optimally thin.

For further reduction of high local current density concentrations that are too high at the ends (in particular at the corners of the dipole strips), it is advantageous for the ends of the dipole strips to be rounded. Moreover, for this purpose it is also advantageous for the ends of the dipole strips to be somewhat broadened.

A carrier element having a shell or envelope filled with a gas, a liquid or a gel is advantageously used as a carrier element with a specific small thickness. Such a carrier element is fashioned relatively soft in the form of a cushion and is therefore also comfortable for the patient.

The filling of the pillow is advantageously dielectric and possibly additionally conductive with low resistance (i.e. it exhibits approximately the conductivity of human tissue).

Theoretically pure water or distilled water can be used as a dielectric fluid. A saline solution could be used, for example, in order to obtain an additional low-resistance conductive material. The coupling of the dipole strips ensues purely capacitively in the body of the patient by displacement currents over the entire thickness of the cushion. Only the insulator layers (i.e. the cushion shell), the clothing of the patient, etc. must be capacitively bridged. A stronger coupling of the dipole strips to the body of the patient can ensue given a carrier element with a conductive filling. This leads to stronger loop currents and a wider resonance curve. In such a case the matching of the precise lengths of the dipole strips is therefore non-critical. The use of a carrier element with a conductive material is preferable for this reason.

The filling is particularly preferably gel-like for a particularly good form stability of the entire field distribution correction element.

As with the dielectric cushions, the filling of the carrier element should advantageously be fashioned such that this is not visible in the MR images.

In principle this can be achieved in the same manner as given the dielectric cushions already described according to DE 10 2006 02 594 or DE 10 2004 015 859. This means that a relaxation agent can be introduced into the filling of the carrier material, the relaxation agent ensuring that the protons therein relax relatively quickly and thus are not visible in the MR images. For example, a paramagnetic substance having at least one chemical element of the group of following elements can be used as a relaxation agent: gadolinium, europium, iron, chromium, nickel, copper and manganese. Manganese, in particular in the form $Mn^{2+}$, is particularly preferably used.

Due to the strong relaxation effectiveness of $Mn^{2+}$, the use of a low concentration is sufficient in order to achieve a sufficient invisibility of the cushion in the image. This reduces the influencing of the $B0$ field even further. For example, the use of $Mn^{2+}$-doped ultrasound gel is suitable as a cushion filling.

Particularly given use of a paramagnetic substance, the relaxation agent particularly is present in a concentration of 10 to 200 mmol/kg relative to the filling of the cushion, particularly preferably 30 to 100 mmol/kg.

The aforementioned documents DE 10 2006 02 594 and DE 10 2004 015 859, in which formulations and components can be referenced with regard to the precise composition of the materials. As specified in the latter document, the relaxation agent preferably should be bound to particles separated from one another in order to achieve the advantages described there.

Another alternative in which the filling of the carrier element or, respectively, the carrier element itself is invisible is described in DE 10 2004 006 551. In this variant it must be ensured that at least the filling of the carrier element comprises an electrically conductive or dielectric material whose magnetic resonance lines are displaced by at least a specific amount relative to the magnetic resonance line of water protons in a given magnetic field. Given the generation of the magnetic resonance exposures is must then be ensured that a measurement sequence is used so that the material of the carrier element or, respectively, at least the filling of the carrier element supplies no signal contributions to the image generation given an acquisition of the image raw data and/or the signals caused by this material can be separated without further measures from the signals caused by the examination subject. The manner by which such measurement sequences could appear in order to achieve this purpose given a dielectric element which is produced from corresponding materials is described in DE 10 2004 006 551. Inasmuch this document is referenced.

BRIEF DESCRIPTION OF THE DRAWINGS

FIG. 3 is a schematic cross-section through a field distribution correction element according to a first exemplary embodiment of the invention that is placed on the abdomen of a patient.

FIG. 4 is a schematic plan view of the field distribution correction element according to FIG. 3 that is placed on the patient.

DESCRIPTION OF THE PREFERRED EMBODIMENTS

Figure 1:
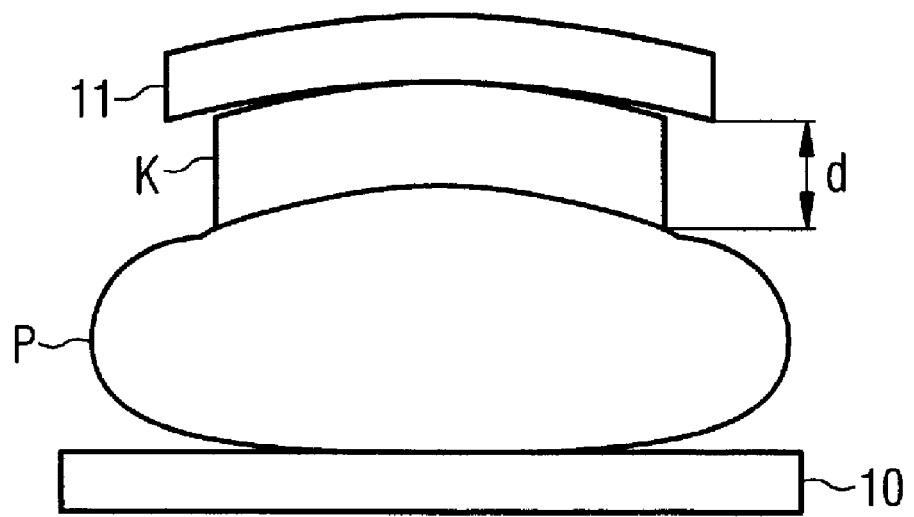
FIG. 1 is a schematic cross-section through a dielectric cushion according to the prior art that is placed on the abdomen of a patient.

FIG. 1 shows a typical dielectric element as is described, for example, in DE 10 2004 015 859 and is already used in practice. This dielectric cushion K is placed on the abdomen of a patient P lying on a bed 10 of the magnetic resonance system in order to locally increase the field strength of the $B_1$ field in the abdomen region, i.e. below the cushion K. A local coil 11, for example, is placed on this dielectric cushion K to measure the magnetic resonance signals.

Figure 2:
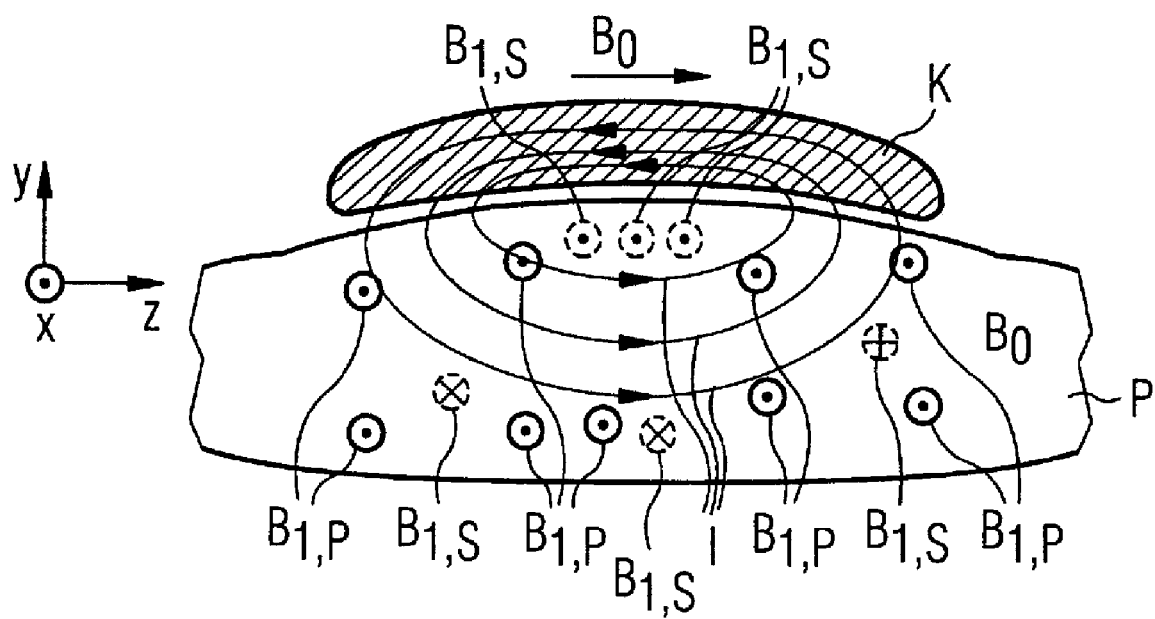
FIG. 2 is a schematic depiction of the mode of operation of the dielectric cushion shown in FIG. 1.

The effect of such a dielectric cushion K is visible from FIG. 2. The orientation here is such that the z-direction runs parallel to the basic magnetic field $B_0$ in the longitudinal direction of the body of the patient P. The x-direction projects from the image plane and the y-direction stands perpendicular to the x-/z-plane, as depicted by the coordinate system.

Due to the radiated resonance signal a primary $B_1$ field is present in the body of the patient P. Due to this $B_1$ field $B_{1,P}$ a circuit current (shown as a current loop I) is induced within the dielectric cushion K itself as well as in the body of the patient P in the region below the cushion K, which circuit current has the direction shown in FIG. 2. A secondary $B_1$ field $B_{1,S}$ is induced in turn in the body of the patient P by this induced alternating current. Since the field lines run annularly around the current lines of the current loop I, this secondary $B_1$ field $B_{1,S}$ is aligned such that the orientation of the secondary field $B_{1,S}$ supports the primary field $B_{1,P}$ inside the current loop I, i.e. in the part of the patient P near the dielectric cushion K. Outside the current loop I the secondary $B_{1,S}$ field is opposite the orientation of the primary field $B_{1,P}$.

The dielectric cushion K thereby lies with its longitudinal dimension in the current path of the current loop I. Since the ratio of the relatively large length to the smaller thickness of the cushion K is significant for the resistance of the path of the induced current, the cushion K may not have a very small thickness. Moreover, the filling material in the cushion K must have a good conductivity or an extraordinarily high dielectric permittivity. Therefore in practice cushions K with an optimized cushion geometry are used that are 35 cm long and 25 cm wide and whose thickness d is 4 cm. The cushions are filled with a gel and are relatively heavy with a weight of approximately 3.5 kg.

An exemplary embodiment of an inventive field distribution correction element 1 which has the same effect as the dielectric cushion K according to FIGS. 1 and 2 but is significantly thinner and lighter is schematically depicted in FIGS. 3 and 4.

Instead of a thick dielectric cushion K this field distribution correction element 1 comprises merely a very thin cushion-shaped carrier element 5 (also called a cushion 5 for short in the following) with the thickness $h \leq 1$ cm. This cushion 5 actually serves merely as a carrier for a system 4 of dipole strips 2 applied on the top side of the cushion 5. The dipole strips 2 can hereby simply be parallel-running conductor strips (for example made from copper or another metal) that are applied (for example glued) directly onto the shell of the cushion-shaped carrier element 5.

The separation a of these metal conductor traces corresponds to approximately the thickness h of the cushion 5. As mentioned above, the cushion 5 serving as a carrier element can be designed in the same manner as the conventional dielectric cushion K, meaning that it can comprise a film shell with a dielectrically active and possibly conductive gel located therein. The filling material (filler) should be only moderately conductive (for example exhibit approximately the conductivity of the human tissue). This means that it is not necessary (as with the dielectric cushions K according to the known prior art) that a strongly conductive substance or a substance with a high dielectricity constant is used. However, it should be attended to that the substance is optimally biologically innocuous. It has been shown that an $Mn^{2+}$-doped ultrasound gel which is provided with a rotation axis to make it invisible in the MR images is suitable.

Figure 5:
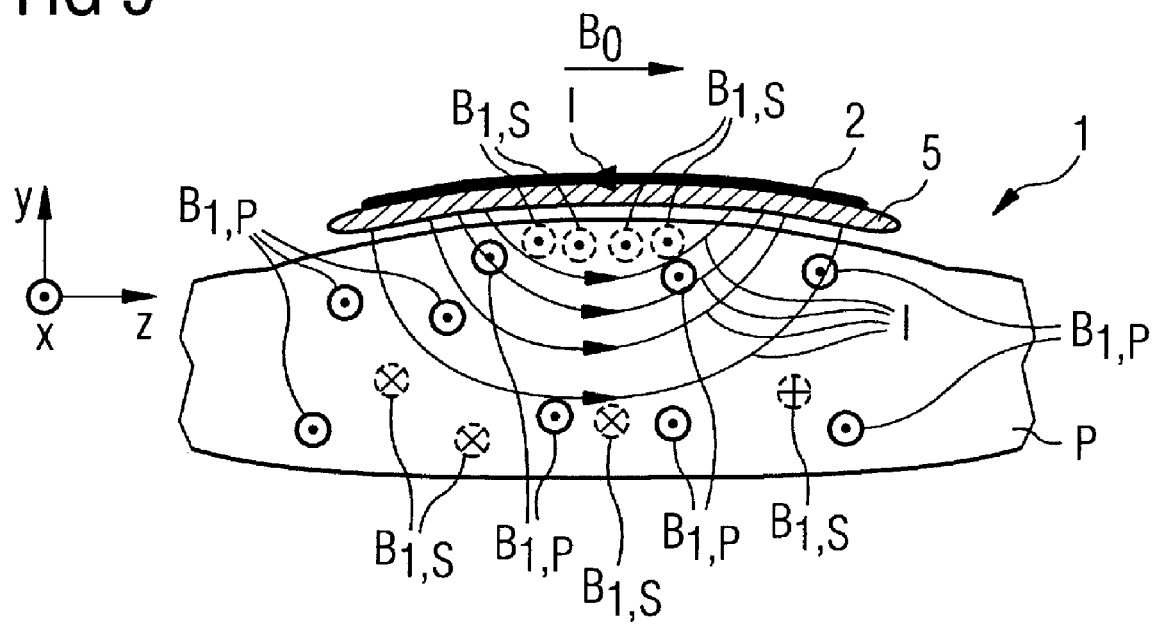
FIG. 5 is a schematic depiction of the mode of operation of the field distribution correction element shown in FIGS. 3 and 4.

FIG. 5 is referenced to understand the mode of operation of the field distribution correction element 1. Here the field lines are shown in FIG. 2 analogous to the depiction for the conventional dielectric cushion K. The z-direction is again the longitudinal direction of the patient P parallel to the basic magnetic field $B_0$ and the x-direction projects from the image plane.

Here as well the primary $B_1$ field $B_{1,P}$ which is achieved via radiation of the radio-frequency pulses is again visible. Since the dipole strips 2 lie parallel to the $B_0$ field (see also FIG. 4), the E-field component of this primary $B_1$ field $B_{1,P}$ is parallel to the longitudinal direction of the dipole strips 2 and couples into the dipole strips 2 as with a typical dipole antenna. It therefore forms an induced circuit current along the shown current loops I which runs along the dipole strips 2, passes through the carrier element 5 and meets the skin of the patient P and then closes through the patient tissue. A current that in turn has a secondary RF field (i.e. a secondary $B_1$ field $B_{1,S}$) is thereby excited along these current loops I by the x-component of the radio-frequency transmission magnetic field. Here as well the orientation of the secondary fields $B_{1,S}$ supports the primary field $B_{1,P}$ inside the current loop I, thus in the regions of the patient P near the dipole strips. Outside of the current loop I, in the lower region of the patient tissue the secondary $B_{1,S}$ field is opposite the orientation of the primary field $B_{1,P}$.

The length of the dipole strips 2 is selected here such that it corresponds to approximately half the wavelength of the sent radio-frequency field, whereby the length of the dipole strips preferably lies somewhat below half the wavelength. It is therefore ensured that the secondary field within the loop is approximately equiphase with the primary field $B_{1,P}$, such that a strong field increase is achieved in the upper region near the field distribution correction element 1, which field increase is well suited to compensate field minima frequently occurred in this region. Given an $H_1$ measurement with 3 Tesla in a magnetic resonance apparatus the MR frequency lies at approximately 120 MHz, meaning that the wavelength is 2.5 m. From this it arises that the length of the dipole strips under these conditions should advantageously be approximately 30-40 cm.

On the basis of the previously used dielectric cushions with the dimensions of 35 cm×25 cm×4 cm, a carrier element 5 with the length of 35 cm, a width of 25 cm and a thickness h of 1 cm is selected as an ideal cushion geometry for a preferred exemplary embodiment of the inventive field distribution correction element 1. Given a use of an $Mn^{2+}$-doped ultrasound gel which exhibits a sufficient dielectric and is not visible in the MR images, this leads to a total weight of only approximately 0.9 kg. The inventive field distribution correction element is thus significantly lighter and thinner than a conventional dielectric cushion K with identical effect.

Figure 6:
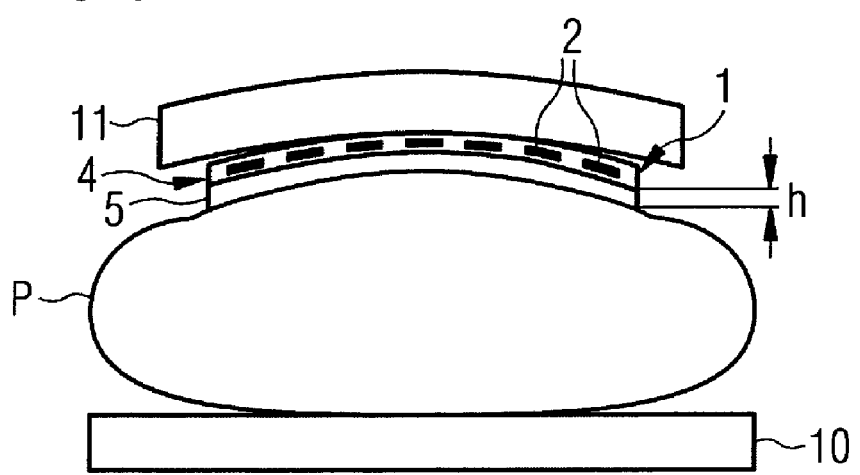
FIG. 6 is a schematic cross-section through the field distribution correction element placed on the abdomen of the patient as in FIG. 3, but with a local coil placed thereon.

An advantage of the inventive field distribution correction element 1 thus already exists in the easier handling capability and the lower stress for the patient. A further advantage is immediately apparent from FIGS. 6 and 7.

Figure 7:
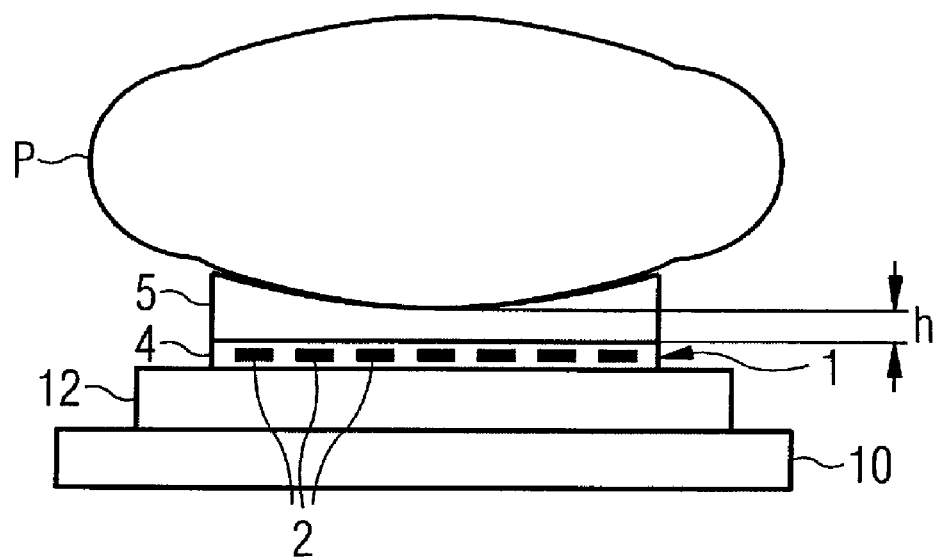
FIG. 7 is a schematic cross-section through a field distribution correction element according to FIGS. 3 through 6 that is placed below the back of a patient as well as a local coil arranged beneath this.

In FIG. 7 it is seen that a local coil 11 placed on the patient P is positioned significantly closer to the patient P than given the use of a conventional dielectric cushion K (see FIG. 1). The signal-to-noise ratio of the acquired MR signals is significantly better due to the smaller distance.

Given this cushion the possibility also exists to place this below the patient when, for example, a spinal column acquisition should be made with a local coil 12 this is apparent in FIG. 7. For this the spinal column local coil 12 is initially placed on the bed 10. The inventive field distribution correction element 1 is placed atop this. The patient P is thereupon positioned. Since the field distribution correction element 1 which includes only the 1 cm-thick carrier element 5 and the thin dipole strips 2 applied thereon is relatively thin, it is no problem to place such an element 1 under the back of the patient P. By contrast, this arrangement would not be possible or would be possible only with difficulty given a conventional dielectric cushion K. In such a case the $B_1$ field in the region of interest (here the spinal column of the patient P) can thus also be intensified with the inventive field distribution correction element 1 in order to compensate local minima of the primary $B_1$ field.

Figure 8:
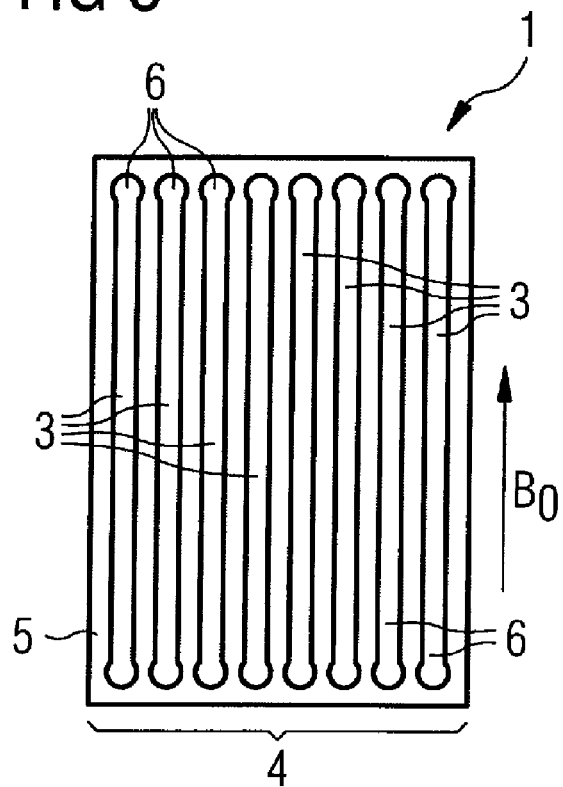
FIG. 8 is a schematic plan view of a field distribution correction element according to a second exemplary embodiment of the invention.

FIG. 8 shows a variant of the field distribution correction element 1 which differs from the exemplary embodiment according to FIG. 3 only in the shape of the dipole strips 3. In this field distribution correction element 1 the dipole strips 3 exhibit respectively widened and rounded ends 6 so that too-high current density concentrations that could be harmful for the patient do not occur at the corners of the dipole strips 3. This shape of the dipole strips 3 is in particular reasonable when an even thinner carrier element 5 should be used and therefore the distance between the dipole strips 3 and the skin surface of the patient P is less.

Although modifications and changes may be suggested by those skilled in the art, it is the intention of the inventors to embody within the patent warranted hereon all changes and modifications as reasonably and properly come within the scope of their contribution to the art.

We claim as our invention:

1. A field distribution correction element comprising:
a carrier element configured for placement on an examination subject in a magnetic resonance apparatus in which a radio-frequency field, having a field distribution, is generated; and
a plurality of electrically conductive dipole strips on said carrier element, said strips being spaced from and substantially parallel to each other, said strips having a composition, configuration and arrangement on said carrier that substantially homogenizes said field distribution in a region outside of said carrier occupied by the examination subject.

2. A field distribution correction element as claimed in claim 1 wherein said dipole strips are comprised of metallic conductor traces on said carrier.

3. A field distribution correction element as claimed in claim 1 wherein said radio-frequency field is generated at a radio-frequency wavelength, and wherein said dipole strips have a strip length that is less than or equal to one-half of said radio-frequency wavelength.

4. A field distribution correction element as claimed in claim 1 wherein said carrier element has a predetermined thickness that is dependent on said dipole strips.

5. A field distribution correction element as claimed in claim 4 wherein said thickness of said carrier element substantially equals a distance between two adjacent ones of said dipole strips.

6. A field distribution correction element as claimed in claim 1 wherein each of said dipole strips has rounded ends.

7. A field distribution correction element as claimed in claim 1 wherein each of said dipole strips has broadened ends.

8. A field distribution correction element as claimed in claim 1 wherein said carrier element comprises a shell filled with a material selected from the group consisting of a gas, a liquid, and a gel.

9. A field distribution correction element as claimed in claim 1 wherein said carrier element comprises a shell filled with a dielectric material.

10. A field distribution correction element as claimed in claim 9 wherein said dielectric material is slightly electrically conductive.

11. A field distribution correction element as claimed in claim 1 wherein said carrier element is comprised of material that is substantially invisible in a magnetic resonance image.

12. A field distribution correction element as claimed in claim 1 wherein said carrier element comprises a shell filled with a material that includes a magnetic resonance relaxation agent.

13. A field distribution correction element as claimed in claim 12 wherein said relaxation agent is bound to particles in said material that are separated from each other.

14. A field distribution correction element as claimed in claim 1 wherein said carrier element comprises a shell filled with a material exhibiting at least one magnetic resonance line that is shifted by a predetermined amount in a predetermined magnetic field, relative to the magnetic resonance line of water protons in said predetermined magnetic field.

15. A method for generating a magnetic resonance exposure of an examination subject, comprising the steps of:
placing an examination subject in a static, basic magnetic field and exposing the examination subject to a magnetic resonance imaging pulse sequence that includes generating a radio-frequency field having a field distribution; and
substantially homogenizing said field distribution in the examination subject by placing a carrier on the examination subject having a plurality of electrically conductive dipole strips thereon that are spaced from and substantially parallel to each other, and that are substantially parallel to said basic magnetic field.

* * * * *